(12) United States Patent
Yoon

(10) Patent No.: US 11,810,983 B2
(45) Date of Patent: Nov. 7, 2023

(54) SEMICONDUCTOR DEVICE WITH MULTIPLE FLOATING GATES FOR MULTI-LEVEL CAPACITANCE CHANGES

(71) Applicant: ULSAN NATIONAL INSTITUTE OF SCIENCE AND TECHNOLOGY, Ulsan (KR)

(72) Inventor: Tae Sik Yoon, Seoul (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 17/393,805

(22) Filed: Aug. 4, 2021

(65) Prior Publication Data

US 2022/0045217 A1 Feb. 10, 2022

(30) Foreign Application Priority Data

Aug. 5, 2020 (KR) .................. 10-2020-0097924
Jul. 29, 2021 (KR) .................. 10-2021-0099764

(51) Int. Cl.
*H01L 29/788* (2006.01)
*H01L 29/51* (2006.01)
(Continued)

(52) U.S. Cl.
CPC .... *H01L 29/7887* (2013.01); *H01L 29/42332* (2013.01); *H01L 29/517* (2013.01); *H01L 29/495* (2013.01); *H01L 29/4958* (2013.01)

(58) Field of Classification Search
CPC ........... H01L 29/7887; H01L 29/42332; H01L 29/517; H01L 29/495; H01L 29/4958;
(Continued)

(56) References Cited

U.S. PATENT DOCUMENTS 7,138,680 B2    11/2006  Li et al.
8,097,872 B2    1/2012   Kreupl
(Continued)

FOREIGN PATENT DOCUMENTS

| CN | 101047192 B | * | 3/2013 | .......... H01L 27/105 |
|---|---|---|---|---|
| KR | 2008-0038045 A | | 5/2008 | |
| KR | 2019-0008051 A | | 1/2019 | |

OTHER PUBLICATIONS

Minju Kim et al., 'Nonvolatile reversible capacitance changes through filament formation in a floating-gate metal-oxide-semiconductor capacitor with Ag/CeO$_x$/Pt/HfO$_x$/n-Si structure' *Applied Physics Letters*, 115, Aug. 2019, pp. 072106-1-072106-5.

*Primary Examiner* — Shahed Ahmed
(74) *Attorney, Agent, or Firm* — Harness, Dickey & Pierce, P.L.C.

(57) ABSTRACT

Provided is a semiconductor device including a substrate, a tunneling insulating film disposed on the substrate, a control gate electrode disposed on the tunneling insulating film, a first floating gate electrode disposed between the control gate electrode and the tunneling insulating film, a second floating gate electrode disposed between the first floating gate electrode and the tunneling insulating film, a first control gate insulating film disposed between the first floating gate electrode and the control gate electrode, a second control gate insulating film disposed between the second floating gate electrode and the first floating gate electrode, and a source electrode and a drain electrode disposed on the substrate to be spaced apart from each other with respect to the control gate electrode, wherein the control gate electrode includes a first metal material, wherein the first floating gate electrode includes a second metal material, wherein the second floating gate electrode includes a third metal material, wherein the first to third metal materials are different (Continued)

from each other, wherein an oxidizing power of the second metal material is smaller than an oxidizing power of the first metal material.

15 Claims, 5 Drawing Sheets

(51) Int. Cl.
*H01L 29/423* (2006.01)
*H01L 29/49* (2006.01)

(58) Field of Classification Search
CPC ........... H01L 23/5252; H01L 27/11206; H01L 29/40114; H01L 27/11517–1156; H01L 29/42324–42336; H01L 21/76202–76221; H01L 29/122–127; G11C 11/56; G11C 11/5614; G11C 13/0069; G11C 2013/0073; G11C 2213/53; G11C 13/0011; G11C 16/0425; G11C 16/0408–0458; G11C 11/5621–5642; G11C 2216/06–10; H10B 41/47; H10B 41/00–70

See application file for complete search history.

(56) References Cited

U.S. PATENT DOCUMENTS

| | | |
|---|---|---|
| 10,497,433 B2 | 12/2019 | Lee |
| 2006/0054943 A1* | 3/2006 | Li .................... H01L 29/7883 257/E21.422 |
| 2007/0145458 A1* | 6/2007 | Asami .................... H01L 21/84 257/E27.113 |
| 2009/0283817 A1* | 11/2009 | Krishnamohan ... H01L 29/7881 257/E21.179 |
| 2012/0181584 A1 | 7/2012 | Huang et al. |
| 2014/0084356 A1* | 3/2014 | Aoki .................... H01L 29/792 438/424 |
| 2016/0268388 A1* | 9/2016 | Itokawa ............ H01L 21/02271 |

* cited by examiner

SEMICONDUCTOR DEVICE WITH MULTIPLE FLOATING GATES FOR MULTI-LEVEL CAPACITANCE CHANGES

CROSS-REFERENCE TO RELATED APPLICATIONS

This U.S. non-provisional patent application claims priority under 35 U.S.C. § 119 to Korean Patent Application Nos. 10-2020-0097924, filed on Aug. 5, 2020, and 10-2021-0099764, filed on Jul. 29, 2021 the entire contents of which are hereby incorporated by reference.

BACKGROUND

The present disclosure herein relates to a semiconductor device, and more particularly, to a semiconductor device having non-volatile behavior.

A non-volatile memory such as a flash memory retains its stored data even when there is no power. As a general type of non-volatile memory, there is flash memory used in a wide variety of electronic equipment including digital cameras, portable audio players, wireless communication devices, personal digital assistants, peripherals, and firmware for storage in computers and other devices. A major challenge for flash memory and other non-volatile memory technologies over the next few years is to achieve the ever-demanding increase in density in the market. This requires the cell size to be continuously reduced, which leads to various attempts in design and manufacturing.

SUMMARY

The present disclosure provides a semiconductor device capable of stepwise and multi-level capacitance change.

An embodiment of the inventive concept provides a semiconductor device including: a substrate; a tunneling insulating film disposed on the substrate; a control gate electrode disposed on the tunneling insulating film; a first floating gate electrode disposed between the control gate electrode and the tunneling insulating film; a second floating gate electrode disposed between the first floating gate electrode and the tunneling insulating film; a first control gate insulating film disposed between the first floating gate electrode and the control gate electrode; a second control gate insulating film disposed between the second floating gate electrode and the first floating gate electrode; and a source electrode and a drain electrode disposed on the substrate to be spaced apart from each other with respect to the control gate electrode, wherein the control gate electrode includes a first metal material, wherein the first floating gate electrode includes a second metal material, wherein the second floating gate electrode includes a third metal material, wherein the first to third metal materials are different from each other, wherein an oxidizing power of the second metal material is smaller than an oxidizing power of the first metal material.

In an embodiment, an oxidizing power of the third metal material may be higher than the oxidizing power of the first metal material.

In an embodiment, the first metal material may include silver, copper or cobalt, wherein the second metal material may include aluminum.

In an embodiment, a first conductive filament may be formed on the first control gate insulating film by a first voltage applied to the control gate electrode, wherein a second conductive filament may be formed on the second control gate insulating film to electrically connect the second floating gate electrode and the control gate electrode.

In an embodiment, in a state in which the first and second conductive filaments are formed, when a second voltage having a polarity opposite to that of the first voltage is applied to the control gate electrode, the first and second conductive filaments may be sequentially ruptured.

In an embodiment, a total capacitance may be changed step by step by the ruptured first and second conductive filaments.

In an embodiment, the first conductive filament may include silver ions, wherein the second conductive filament may include silver ions or oxygen vacancy.

In an embodiment, each of the first and second control gate insulating films may include $CeO_2$.

In an embodiment, the first floating gate electrode may include a first conductive layer and second conductive layer, which are stacked, wherein the first conductive layer may be disposed adjacent to the control gate electrode and the second conductive layer, wherein the second conductive layer may be adjacent to the second floating gate electrode than the first conductive layer, wherein the first conductive layer may include the third metal material, wherein the second conductive layer may include the second metal material.

In an embodiment of the inventive concept, a semiconductor device including: a substrate; a tunneling insulating film disposed on the substrate; a control gate electrode disposed on the tunneling insulating film; a first floating gate electrode disposed between the control gate electrode and the tunneling insulating film; a second floating gate electrode disposed between the first floating gate electrode and the tunneling insulating film; a first control gate insulating film disposed between the first floating gate electrode and the control gate electrode; a second control gate insulating film disposed between the second floating gate electrode and the first floating gate electrode; and a source electrode and a drain electrode disposed on the substrate to be spaced apart from each other with respect to the control gate electrode, wherein the control gate electrode includes a first metal material, wherein the first floating gate electrode includes a second metal material, wherein the second floating gate electrode includes a third metal material, wherein the first to third metal materials are different from each other, wherein an ionic mobility of the second metal material is less than an ionic mobility of the first metal material In an embodiment, an oxidizing power of the third metal material may be greater than an oxidizing power of the first metal material and an oxidizing power of the second metal material.

In an embodiment, each of the first and second control gate insulating films may include $CeO_2$.

In an embodiment, a first conductive filament may be formed on the first control gate insulating film by a first voltage applied to the control gate electrode, wherein a second conductive filament may be formed on the second control gate insulating film to electrically connect the second floating gate electrode and the control gate electrode.

In an embodiment, in a state in which the first and second conductive filaments are formed, when a second voltage having a polarity opposite to that of the first voltage is applied to the control gate electrode, the first and second conductive filaments may be sequentially ruptured.

In an embodiment, a total capacitance may be changed step by step by the ruptured first and second conductive filaments.

In an embodiment, the first floating gate electrode may include a first conductive layer and a second conductive layer, which are stacked, wherein the first conductive layer may be disposed adjacent to the control gate electrode and the second conductive layer, wherein the second conductive layer may be adjacent to the second floating gate electrode than the first conductive layer, wherein the first conductive layer may include the third metal material, wherein the second conductive layer may include the second metal material.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In order to fully understand the configuration and effects of the inventive concept, preferred embodiments of the inventive concept will be described in detail with reference to the accompanying drawings. The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, the components are shown to be enlarged in size for convenience of description, and the ratio of each component may be exaggerated or reduced.

In addition, terms used in the present specification may be interpreted as meanings commonly known to those of ordinary skill in the art, unless otherwise defined. Hereinafter, the inventive concept will be described in detail by describing embodiments of the inventive concept with reference to the accompanying drawings.

Hereinafter, a semiconductor device in embodiments of the inventive concept will be described in detail with reference to drawings.

Figure 1:
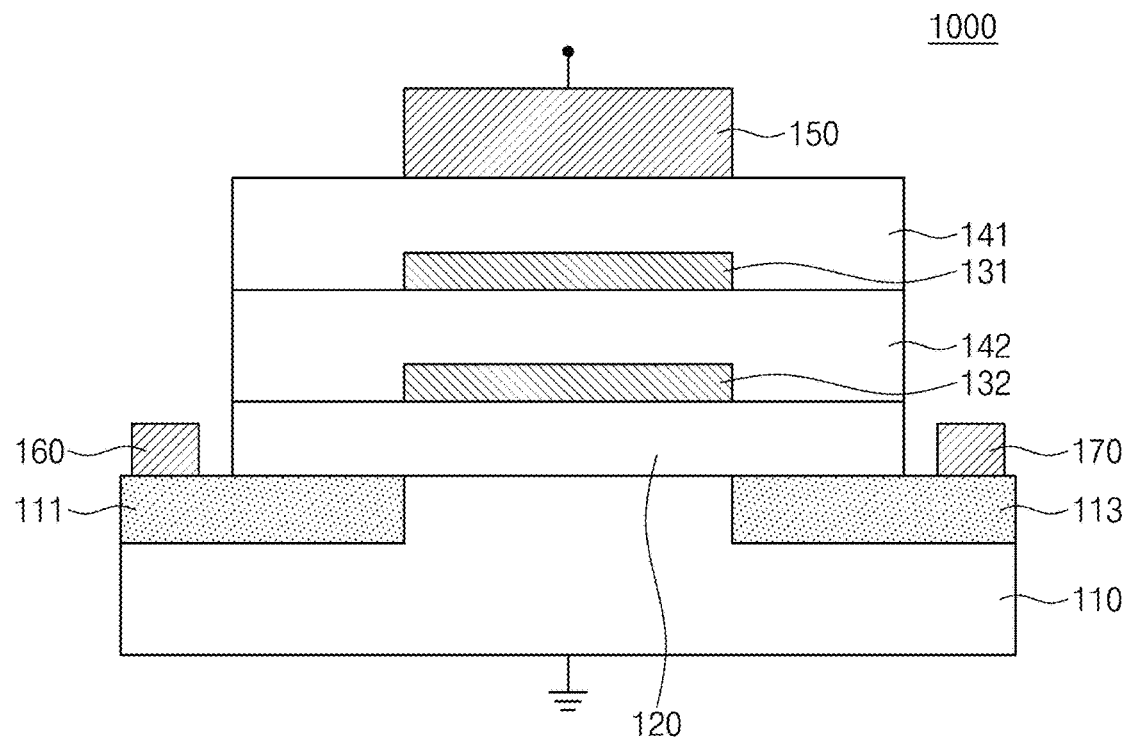
FIG. 1 is a cross-sectional view schematically showing a semiconductor device according to the inventive concept.

FIG. 1 is a diagram schematically illustrating a semiconductor device according to the inventive concept. Referring to FIG. 1, a semiconductor device 1000 may be, for example, a transistor.

The semiconductor device 1000 may include a substrate 110, a tunneling insulating film 120, a first floating gate electrode 131, a first control gate insulating film 141, a second floating gate electrode 132, a second control gate insulating film 142, a source electrode 160, and a drain electrode 170.

The substrate 110 may include a semiconductor material. The substrate 110 may include, for example, silicon (Si) or germanium (Ge). As another example, the substrate 110 may include a compound semiconductor such as gallium arsenide (GaAs) or an oxide semiconductor such as indium-gallium zinc oxide. In an embodiment, the substrate 110 may be a semiconductor substrate doped with a p-type or n-type dopant.

The substrate 110 may include a source area 111 and a drain area 113. A current conduction channel may be formed between the source area 111 and the drain area 113. The source area 111 and the drain area 113 may be doped with a dopant of a type opposite to that of the substrate 110. Although not shown below the substrate 110, a metal layer may be deposited for electrical contact.

The source electrode 160 and the drain electrode 170 may be disposed on the substrate 110 to be spaced apart from each other with respect to the control gate electrode 150. Specifically, the source electrode 160 is disposed in the source area 111 to supply carriers (electrons or holes). In addition, the drain electrode 170 is disposed on the drain area 113 and may be configured to serve as a passage through which carriers supplied from the source area 111 exit to the outside. The source electrode 160 and the drain electrode 170 may be made of, for example, a metal such as titanium (Ti), aluminum (Al), nickel (Ni), and gold (Au), and may be electrically connected to an external device.

The tunneling insulating film 120 may be disposed on the substrate 110. When an external electric field having a magnitude equal to or less than a critical electric field is applied to the tunneling insulating film 120, the tunneling insulating film 120 may have insulating properties. In contrast, when an external electric field having a magnitude greater than or equal to the critical electric field is applied to the tunneling insulating film 120, electrons or holes tunnel the tunneling insulating film 120, thereby supplying electric charge to the second floating gate electrode 132.

In an embodiment, the tunneling insulating film 120 may include an insulating metal oxide. As an example, the tunneling insulating film 120 may include titanium oxide ($TiO_2$), aluminum oxide ($Al_2O_3$), nickel oxide (NiO, $NiO_2$, and $Ni_2O_3$), copper oxide ($Cu_2O$ and CuO), zirconium oxide ($ZrO_2$), manganese oxide (MnO, $MnO_2$, $Mn_2O_3$, $Mn_3O_4$, and $Mn_2O_7$), hafnium oxide ($HfO_2$), tungsten oxide (WO, $WO_2$, $WO_3$, and $W_2O_3$), tantalum oxide ($Ta_2O_5$), niobium oxide ($Nb_2O_5$), iron oxide (FeO, $Fe_2O_3$, and $Fe_3O_4$), and the like.

A control gate electrode 150 may be provided on the tunneling insulating film 120. A first floating gate electrode 131 may be disposed between the control gate electrode 150 and the tunneling insulating film 120. A second floating gate electrode 132 may be disposed between the first floating gate electrode 131 and the tunneling insulating film 120. A first control gate insulating film 141 may be interposed between the first floating gate electrode 131 and the control gate electrode 150. According to some embodiments, the first control gate insulating film 141 may extend to cover a side surface of the first floating gate electrode 131. A second control gate insulating film may be interposed between the first floating gate electrode 131 and the second floating gate electrode 132. According to some embodiments, the second control gate insulating film 142 may extend to cover the side surface of the second floating gate electrode 132.

Each of the first control gate insulating film 141 and the second control gate insulating film 142 may include a metal oxide. The metal oxide may serve as an electrolyte. Each of the first control gate insulating film 141 and the second control gate insulating film 142 may include $HfO_x$, $CeO_x$, $TaO_x$, $ZrO_x$, and the like. For example, each of the first control gate insulating film 141 and the second control gate insulating film 142 may include $CeO_2$.

The control gate electrode 150 may include a first metal material, the first floating gate electrode 131 may include a second metal material, and the second floating gate electrode 132 may include a third metal material. The first to third metal materials may be different metal materials.

In other words, the control gate electrode 150 may be referred to as a first active electrode. The active electrode refers to an electrode that directly participates in oxidation and reduction reactions when a voltage is applied. The first metal material may be, for example, silver, copper, or cobalt.

The first floating gate electrode 131 may be referred to as a second active electrode in other words. The second metal material may be a metal material having weaker oxidizing power than the first metal material. That is, the second metal material may be a metal material that is more easily oxidized than the first metal material. The second metal material may be a material having lower ionic mobility than the first metal material. Ionic mobility refers to the speed of ions moving in an electric field. For example, when an electric field is applied, ions of the second metal material may have a lower movement speed than ions of the first metal material in the first control gate insulating film 141.

The second metal material may be, for example, aluminum, titanium, or other metal materials than tend to absorb oxygen ions from the second control gate insulating film when an electric field is applied.

The second floating gate electrode 132 may be referred to as an inert electrode in other words. The inert electrode is an electrode that acts as a conductor when voltage is applied, but does not undergo oxidation or reduction reactions. The third metal material may be a material having stronger oxidizing power than the first metal material. The third metal material may be, for example, platinum (Pt), iridium (Ir), tungsten (W,) gold (Au), or ruthenium (Ru). The second floating gate electrode 132 may include a metal nitride, for example, tantalum nitride (TaN) or titanium nitride (TiN).

Figure 2:
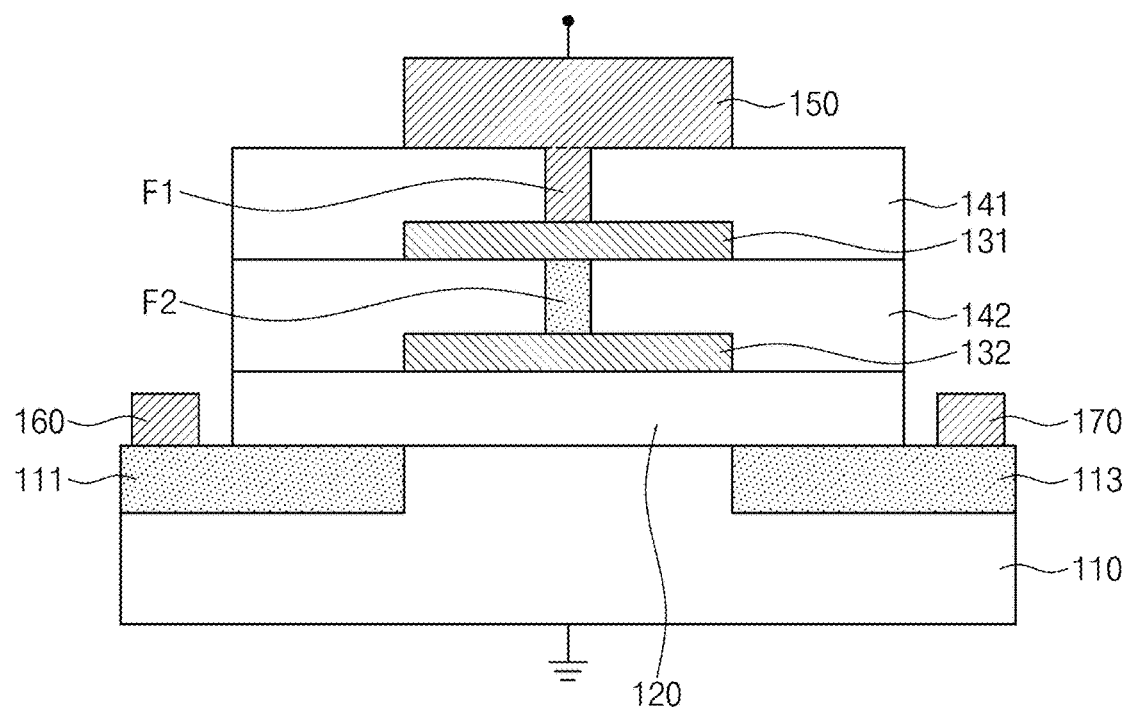
FIGS. 2 and 3 are diagrams illustrating an operation process of the semiconductor device of FIG. 1.
Figure 3:
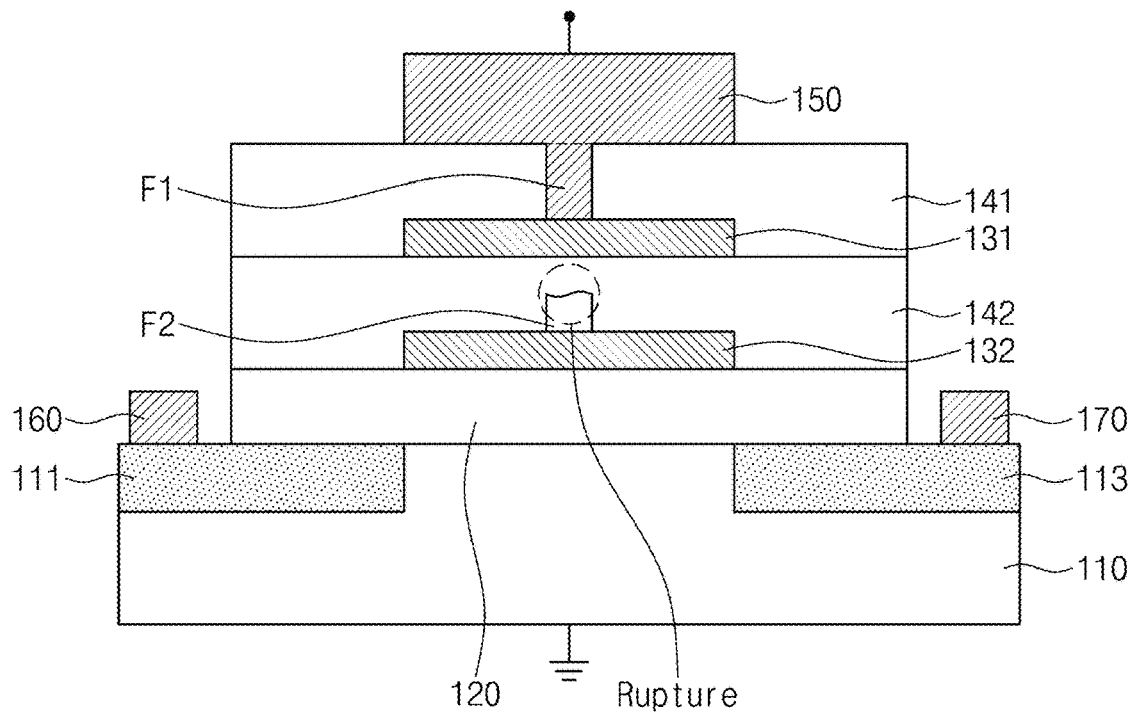

FIGS. 2 and 3 are diagrams illustrating an operation process of the semiconductor device of FIG. 1.

Referring to FIGS. 1 and 2, a voltage greater than or equal to a threshold voltage may be applied between the substrate 110 and the control gate electrode 150. For example, the substrate 110 may be grounded, and a positive first voltage may be applied to the control gate electrode 150.

FIG. 1 corresponds to an initial state in which a conductive filament is not formed in the first control gate insulating film 141. FIG. 2 shows that the first conductive filament F1 is formed on the first control gate insulating film 141 and the second conductive filament F2 is formed on the second control gate insulating film 142.

Specifically, by the first voltage applied to the control gate electrode 150, a first conductive filament F1 connecting the control gate electrode 150 and the first floating gate electrode 131 may be formed inside the first control gate insulating film 141. In addition, a second conductive filament F2 connecting the first floating gate electrode 131 and the second floating gate electrode 132 may be continuously formed inside the second control gate insulating film 142. According to some embodiments, the second conductive filament F2 may be formed substantially simultaneously with the first conductive filament F1.

FIG. 3 shows a state in which the second conductive filament F2 inside the second control gate insulating film 142 is ruptured. Referring to FIGS. 2 and 3, when a second voltage that is opposite to the first voltage is applied, the second conductive filament F2 may be ruptured. In this case, the second voltage may be a negative voltage. Subsequently, the first conductive filament F1 may be ruptured sequentially as shown in the drawing of FIG. 1.

The first conductive filament F1 may be formed by aggregation of ions of the first metal material of the control gate electrode 150. The second conductive filament F2 may be formed by gathering oxygen vacancies of the second control gate insulating film 142. For example, the first conductive filament F1 may include silver (Ag) ions, and the second conductive filament F2 may include oxygen vacancy. According to some embodiments, the second conductive filament F2 may be formed by diffusion and agglomeration of the first metal material, and for example, the second conductive filament F2 may include silver ions.

(Experimental Example) Fabrication of Multiple (for Example, Double) Floating Gate Capacitors (or Transistors) of $Ag/CeO_2/Al/CeO_2/Pt/HfO_2$/n-Si Structure Using tetrakis(ethylmethylamino)hafnium(Hf[N(CH$_3$) C$_2$H$_5$]$_4$) and H$_2$O on an n-Si substrate, a 15 nm thick HfO$_2$ tunneling insulating film was deposited by atomic layer deposition (ALD). Then, a Pt second floating gate electrode having a thickness of 100 nm was deposited as a pattern having a diameter of 100 μm by e-beam evaporation using a shadow mask. As a second control gate insulating film, a 15 nm thick layer of CeO$_2$ was deposited successively by rf magnetron sputtering using a CeO$_2$ target at the mixed gas flow condition of Ar:O$_2$=1:3. Then, an Al first floating gate electrode having a thickness of 100 nm was deposited as a pattern having a diameter of 100 μm by e-beam evaporation using a shadow mask. Then, as the first control gate insulating film, a 15 nm thick layer of CeO$_2$ was deposited successively by rf magnetron sputtering using a CeO$_2$ target at the mixed gas flow of Ar: 02=1:3. Then, an Ag control gate electrode was deposited by thermal evaporation with a diameter of 100 μm using a shadow mask.

Figure 4:
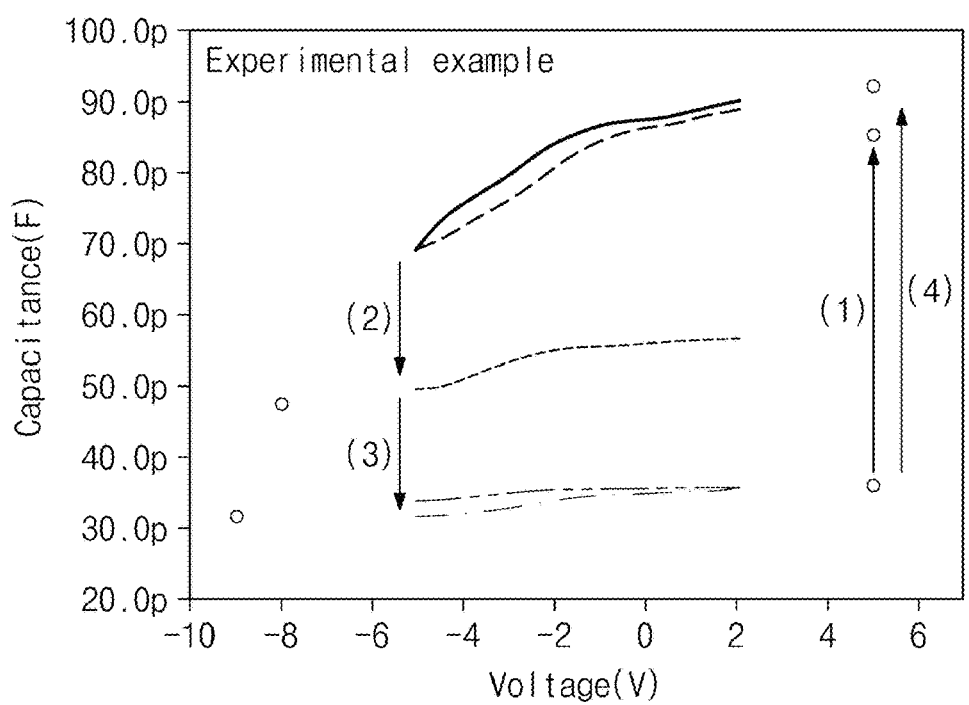
FIG. 4 shows a C-V curve of a semiconductor device according to an experimental example.

FIG. 4 shows a C-V curve of a semiconductor device according to an experimental example. Capacitance-voltage (C-V) measurements were performed using an Agilent 4284A LCR meter by sweeping the gate voltage with a superimposed AC voltage of 50 mV at a frequency of 1 MHz. Voltage pulses were applied with an integration time of 180 ms.

From a capacitance point of view, in the initial state corresponding to FIG. 1, the total capacitance of the semiconductor device 1000 may have a first capacitance of series connection of (i) the control gate electrode 150/the first control gate insulating film 141/the first floating gate electrode 131, (ii) the first floating gate electrode 131/the second control gate insulating film 142/the second floating gate electrode 132, and (iii) the second floating gate electrode 132/the tunneling insulating film 120/the substrate 110. Then, according to the application of the first voltage, as shown in FIG. 2, when the first conductive filament F1 is formed on the first control gate insulating film 141, the control gate electrode 150 and the first floating gate electrode 131 are electrically connected to each other, so that the total capacitance of the semiconductor device 1000 has a second capacitance value greater than the first capacitance value, which is configured with (i) the first floating gate electrode 131/the second control gate insulating film 142/the second floating gate electrode 132, and (ii) the second floating gate electrode 132/the tunneling insulating film 120/the substrate 110. Furthermore, as shown in FIG. 2, when the second conductive filament F2 is further formed, the total capacitance of the semiconductor device 1000 may have a third capacitance that is a single capacitance value of the second floating gate electrode 132/the tunneling insulating film 120/the substrate 110.

Referring to FIG. 4, when the first voltage is applied from the initial state in the C-V curve, the first capacitance value is changed to the third capacitance value (Step (1) in FIG. 4). Thereafter, as the second conductive filament is ruptured according to the application of the second voltage, the third capacitance value is changed to the second capacitance value ((2) of FIG. 4). As the first conductive filament is ruptured, the second capacitance is changed to the first capacitance (Step (3) of FIG. 4). When the first voltage is applied to the semiconductor device 1000 again, the capacitance is changed to the second capacitance or the third capacitance (Step (4) of FIG. 4).

Characteristics such as a drain current, a threshold voltage, or a transfer conductance of the semiconductor device 1000 may be controlled by changing the capacitance. For example, a drain current in a saturation area of the semiconductor device 1000 (e.g. transistor) is proportional to the total capacitance, and a threshold voltage is inversely proportional to the total capacitance.

In this way, the capacitance may be increased step by step by the formation of the conductive filaments sequentially, and similarly, when the conductive filaments are sequentially ruptured by the application of opposite voltages, the capacitance may be decreased step by step.

By sequentially forming or destroying conductive filaments between the control gate electrode and the multi-floating gate electrode using a voltage applied to the control gate electrode in an element having multiple layers of floating gate electrodes, it may be applied to multi-level non-volatile memory and logic devices that write, read, and erase in multiple stages. In particular, this may enable stable and uniform multi-level operation compared to device operation using conventional charge storage.

Figure 5:
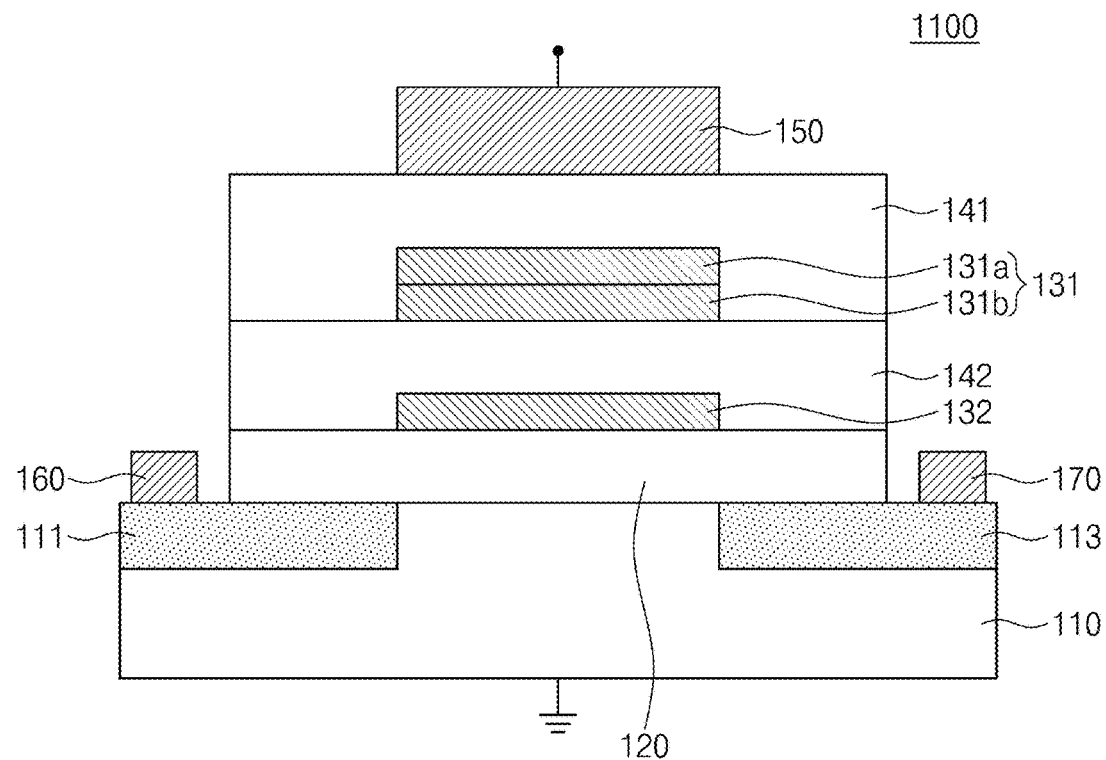
FIG. 5 is a cross-sectional view schematically illustrating a semiconductor device according to some embodiments.

FIG. 5 is a cross-sectional view schematically illustrating a semiconductor device 1100 according to some embodiments. Except for those described below, since it is the same as that of FIG. 1, it will be omitted.

Referring to FIG. 5, the first floating gate electrode 131 may include two stacked conductive layers 131a and 131b. The two conductive layers 131a and 131b may include a first conductive layer 131a and a second conductive layer 131b. The first conductive layer 131a may be located closer to the control gate electrode 150 than the second conductive layer 131b. The second conductive layer 131b may be located closer to the second floating gate electrode 132 than the first conductive layer 131a. The second conductive layer 131b may include a metal material having a lower oxidizing power than the first conductive layer 131a. The first conductive layer 131a may include a third metal material, and the second conductive layer 131b may include a second metal material. For example, the first conductive layer 131a may include Pt, and the second conductive layer 131b may include Al. Similarly, when a first voltage is applied, a first conductive filament F1 may be formed between the control gate electrode 130 and the first conductive layer 131a, and a second conductive filament F2 may be formed between the second conductive layer 131b and the second floating gate electrode 132.

Figure 6:
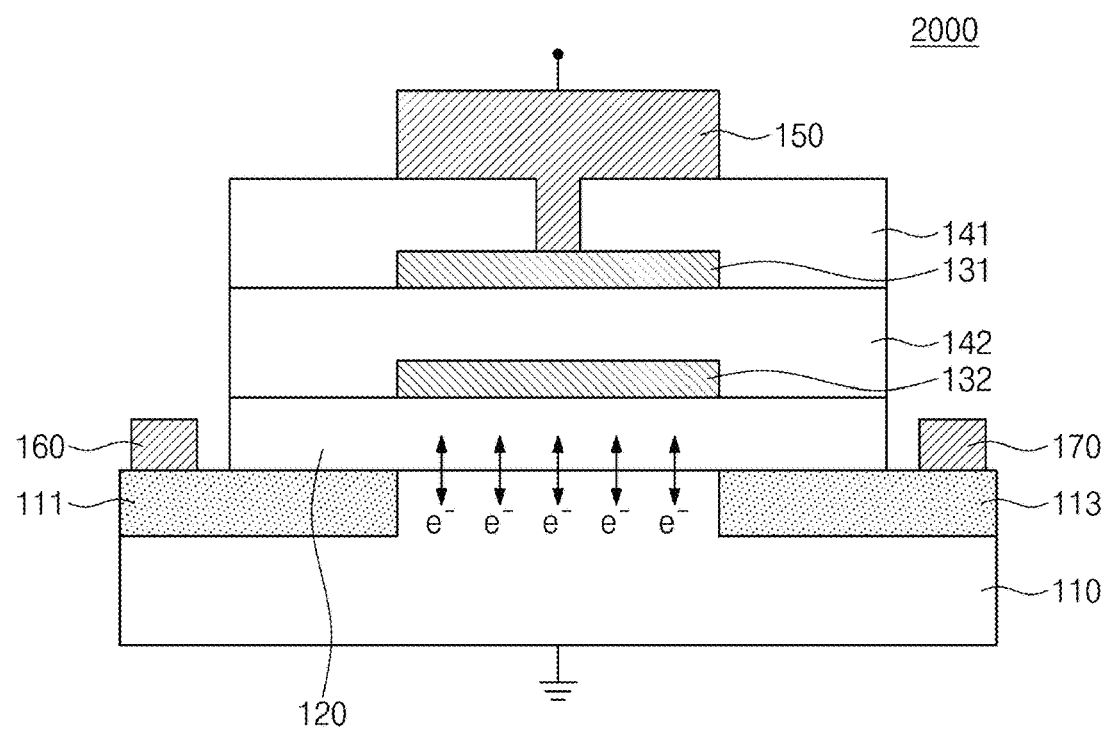
FIG. 6 is a cross-sectional view schematically illustrating an operation process of a semiconductor device according to comparison.

FIG. 6 is a cross-sectional view schematically illustrating an operation process of a semiconductor device according to comparison.

Referring to FIG. 6, according to the semiconductor device 2000 according to the comparative example, the first floating gate electrode 131 may include a first metal material or a second metal material. That is, the first floating gate electrode 131 may include the same material as the control gate electrode 150 or the same material as the second floating gate electrode 132.

In this case, the capacitance is changed when the first voltage is applied, and the first conductive filament F1 may be formed, but the second conductive filament F2 may not be formed. Subsequently, when the second voltage is applied, the capacitance may not be changed, but only the threshold voltage may be changed due to the charge storage (e−).

Also, although not shown in the drawing, in the semiconductor device according to the comparative example, the first floating gate electrode 131 may include a first metal material and the control gate electrode 150 may include a second metal material. For example, the first floating gate electrode 131 may include Ag, and the control gate electrode 150 may include Al. In this case, when a negative voltage is applied to the control gate electrode 150, a filament may be formed in the first control gate insulating film 141. When a positive voltage is applied to the control gate electrode 150, a filament may be formed in the second control gate insulating film 142, and a filament formed on the first control gate insulating film 141 may be ruptured. Unlike the case shown in FIG. 4, since the voltage applied to the control gate electrode 150 may cause the formation and destruction of filaments under both positive and negative voltage conditions, this may be undesirable in terms of driving capacitance control.

(Comparative Example 1) Fabrication of Multiple Floating Gate Capacitors (or Transistors) of Ag/CeO$_2$/Ag/CeO$_2$/Pt/HfO$_2$/n-Si Structure In experimental example 1, instead of the Al floating gate electrode, an Ag floating gate electrode was formed.

(Comparative Example 2) Fabrication of Multiple Floating Gate Capacitors (or Transistors) of Ag/CeO$_2$/Pt/CeO$_2$/Pt/HfO$_2$/n-Si Structure In experimental example 1, instead of the Al floating gate electrode, a Pt floating gate electrode was formed.

Figure 7:
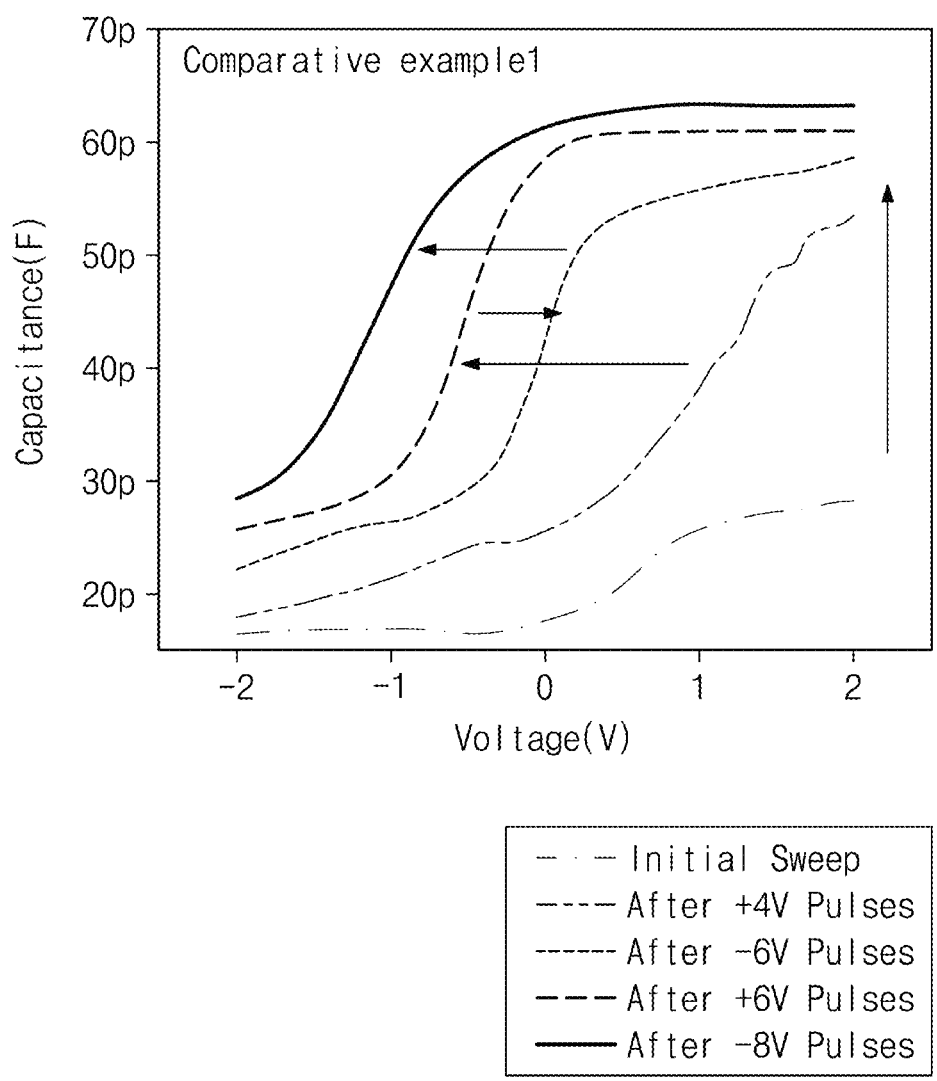
FIG. 7 shows a C-V curve of a semiconductor device according to comparative example 1.

FIG. 7 shows a C-V curve of a semiconductor device according to comparative example 1. Referring to FIG. 7, when a voltage of +4V is applied, the first conductive filament F1 is formed, so that capacitance may increase. Compared with the graph of FIG. 4, the capacitance value may be similar to the capacitance value when only one filament is formed. Subsequently, when a −6V voltage is applied, (+) charges are stored in the tunneling insulating film and the threshold voltage decreases, and after that, as +6V and −8V voltages are applied, (−) charge storage and (+) charge storage are repeated and only the threshold voltage moves.

Figure 8:
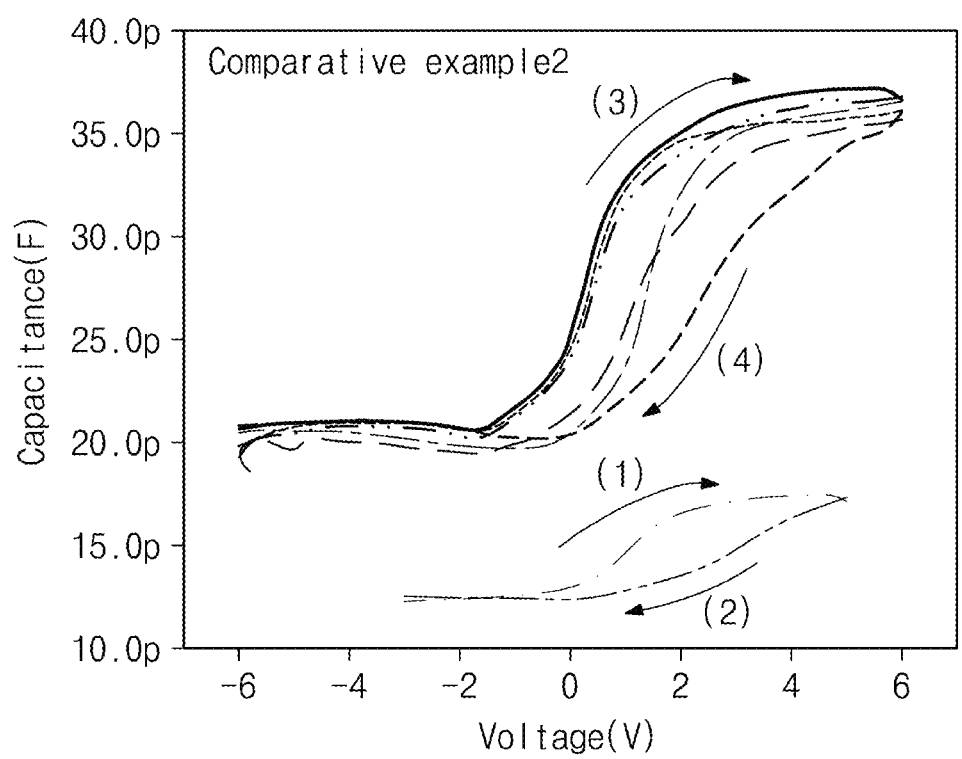
FIG. 8 shows a C-V curve of a semiconductor device according to comparative example 2.

FIG. 8 shows a C-V curve of a semiconductor device according to comparative example 2. Referring to FIG. 8, when the voltage was changed from −3V to +5V and the voltage was changed from +5V to 3V again, the threshold voltage was changed (steps (1) and (2)). After that, when a voltage of +6V was applied as a pulse, the capacitance increased. Compared with the graph of FIG. 4, the capacitance value may be similar to the capacitance value when only one filament is formed. When the voltages of −6V, +6V, and −6V were changed and applied while the capacitance was increased, only the threshold voltage was changed while the capacitance was still increased (steps (3) and (4)). In addition, after stopping the voltage application, even after 10 minutes and 20 minutes elapsed, even when 6V, +6V, and −6V were changed in the same way, only the threshold voltage was changed while the capacitance was still increased (steps (3) and (4)).

Through experimental example, comparative example 1 and comparative example 2 as above, the control gate electrode includes a first metallic material, the first floating gate electrode includes a second metallic material, and the second floating gate electrode includes a third metallic material, but the first to third metal materials are different from each other, and the second metal material has a smaller oxidizing power than the first metal material, and it may be seen that when the ionic mobility is small, a stepwise change in capacitance is made as above. A change in multilevel capacitance may be induced through sequential formation or destruction of a stable conductive filament between the control gate electrode and the multiple floating gate electrodes. This may be applied to a uniform multi-level nonvolatile memory device and a logic device compared to the operation of a semiconductor device using the conventional charge storage.

A semiconductor device according to the inventive concept may have a control gate electrode and a plurality of floating gate electrodes. The capacitance may be adjusted in stages through conductive filaments respectively formed and ruptured between the control gate electrode and the plurality of floating gate electrodes.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:
1. A semiconductor device comprising:
a substrate;
a tunneling insulating film disposed on the substrate;
a control gate electrode disposed on the tunneling insulating film;
a first floating gate electrode disposed between the control gate electrode and the tunneling insulating film;
a second floating gate electrode disposed between the first floating gate electrode and the tunneling insulating film;
a first control gate insulating film disposed between the first floating gate electrode and the control gate electrode;
a second control gate insulating film disposed between the second floating gate electrode and the first floating gate electrode; and
a source electrode and a drain electrode disposed on the substrate to be spaced apart from each other with respect to the control gate electrode,
wherein the control gate electrode comprises a first metal material,
wherein the first floating gate electrode comprises a second metal material,
wherein the second floating gate electrode comprises a third metal material,
wherein the first to third metal materials are different from each other,
wherein an oxidizing power of the second metal material is smaller than an oxidizing power of the first metal material,
wherein the first metal material comprises silver, copper or cobalt,
wherein the second metal material comprises aluminum or titanium, and
wherein the third metal material comprises platinum, iridium, tungsten, gold, ruthenium, tantalum nitride or titanium nitride.

2. The semiconductor device of claim 1, wherein an oxidizing power of the third metal material is higher than the oxidizing power of the first metal material.

3. The semiconductor device of claim 1, wherein a first conductive filament is formed on the first control gate insulating film by a first voltage applied to the control gate electrode,
wherein a second conductive filament is formed on the second control gate insulating film to electrically connect the second floating gate electrode and the control gate electrode.

4. The semiconductor device of claim 3, wherein in a state in which the first and second conductive filaments are formed, when a second voltage having a polarity opposite to that of the first voltage is applied to the control gate electrode, the first and second conductive filaments are sequentially ruptured.

5. The semiconductor device of claim 4, wherein a total capacitance is changed step by step by the ruptured first and second conductive filaments.

6. The semiconductor device of claim 3, wherein the first conductive filament comprises silver ions,
wherein the second conductive filament comprises silver ions or oxygen vacancy.

7. The semiconductor device of claim 1, wherein each of the first and second control gate insulating films comprises $CeO_2$.

8. The semiconductor device of claim 1, wherein the first floating gate electrode comprises a first conductive layer and second conductive layer, which are stacked,
wherein the first conductive layer is disposed adjacent to the control gate electrode and the second conductive layer,
wherein the second conductive layer is adjacent to the second floating gate electrode than the first conductive layer,
wherein the first conductive layer comprises the third metal material,
wherein the second conductive layer comprises the second metal material.

9. A semiconductor device comprising:
a substrate;
a tunneling insulating film disposed on the substrate;
a control gate electrode disposed on the tunneling insulating film;
a first floating gate electrode disposed between the control gate electrode and the tunneling insulating film;
a second floating gate electrode disposed between the first floating gate electrode and the tunneling insulating film;
a first control gate insulating film disposed between the first floating gate electrode and the control gate electrode;

a second control gate insulating film disposed between the second floating gate electrode and the first floating gate electrode; and a source electrode and a drain electrode disposed on the substrate to be spaced apart from each other with respect to the control gate electrode, wherein the control gate electrode comprises a first metal material, wherein the first floating gate electrode comprises a second metal material, wherein the second floating gate electrode comprises a third metal material, wherein the first to third metal materials are different from each other, wherein an ionic mobility of the second metal material is less than an ionic mobility of the first metal material, wherein the first metal material comprises silver, copper or cobalt, wherein the second metal material comprises aluminum or titanium, and wherein the third metal material comprises platinum, iridium, tungsten, gold, ruthenium, tantalum nitride or titanium nitride.

10. The semiconductor device of claim 9, wherein an oxidizing power of the third metal material is greater than an oxidizing power of the first metal material and an oxidizing power of the second metal material.

11. The semiconductor device of claim 9, wherein each of the first and second control gate insulating films comprises $CeO_2$.

12. The semiconductor device of claim 9, wherein a first conductive filament is formed on the first control gate insulating film by a first voltage applied to the control gate electrode, wherein a second conductive filament is formed on the second control gate insulating film to electrically connect the second floating gate electrode and the control gate electrode.

13. The semiconductor device of claim 12, wherein in a state in which the first and second conductive filaments are formed, when a second voltage having a polarity opposite to that of the first voltage is applied to the control gate electrode, the first and second conductive filaments are sequentially ruptured.

14. The semiconductor device of claim 13, wherein a total capacitance is changed step by step by the ruptured first and second conductive filaments.

15. The semiconductor device of claim 9, wherein the first floating gate electrode comprises a first conductive layer and a second conductive layer, which are stacked, wherein the first conductive layer is disposed adjacent to the control gate electrode and the second conductive layer, wherein the second conductive layer is adjacent to the second floating gate electrode than the first conductive layer, wherein the first conductive layer comprises the third metal material, wherein the second conductive layer comprises the second metal material.

* * * * *